United States Patent
O'Sullivan et al.

(10) Patent No.: US 11,271,574 B1
(45) Date of Patent: Mar. 8, 2022

(54) FREQUENCY SYNTHESIZER WITH SELECTABLE MODES

(71) Applicant: QUALCOMM INCORPORATED, San Diego, CA (US)

(72) Inventors: Tomas O'Sullivan, San Diego, CA (US); Lai Kan Leung, San Marcos, CA (US); Dongling Pan, San Diego, CA (US); Jianjun Yu, San Diego, CA (US); Dongmin Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/197,827

(22) Filed: Mar. 10, 2021

(51) Int. Cl.
*H03L 7/185* (2006.01)
*H03L 7/099* (2006.01)

(52) U.S. Cl.
CPC ............ *H03L 7/185* (2013.01); *H03L 7/0995* (2013.01)

(58) Field of Classification Search
CPC ......... H03L 7/08; H03L 7/099; H03L 7/0995; H03L 7/0996; H03L 7/0997; H03L 7/0998; H03L 7/16; H03L 7/18; H03L 7/183; H03L 7/185
See application file for complete search history.

(56) References Cited

U.S. PATENT DOCUMENTS

| | | |
|---|---|---|
| 5,389,898 A | 2/1995 | Taketoshi et al. |
| 7,917,788 B2 | 3/2011 | May |
| 8,054,138 B2 | 11/2011 | Kondo |
| 9,467,092 B1 | 10/2016 | Dreps et al. |
| 10,298,244 B2 | 5/2019 | Hossain et al. |
| 2009/0257445 A1* | 10/2009 | Chan ..................... H04L 49/352 370/463 |
| 2017/0047932 A1* | 2/2017 | Gopalakrishnan .... H03L 7/1974 |

* cited by examiner

*Primary Examiner* — Diana J. Cheng
(74) *Attorney, Agent, or Firm* — Smith Tempel Blaha LLC

(57) ABSTRACT

A frequency synthesizer system may include a first voltage-controlled oscillator (VCO) circuit, a second VCO circuit, and multiplexing circuitry. The multiplexing circuitry may be configured to select either the output of the first VCO circuit or the output of the second VCO circuit in response to a mode selection signal.

29 Claims, 13 Drawing Sheets

FREQUENCY SYNTHESIZER WITH SELECTABLE MODES

FIELD

The present disclosure relates to wireless communications, and more particularly, to frequency synthesizer circuits in radio frequency transceivers.

BACKGROUND

Power saving is an important consideration in portable communication devices such as mobile phones. In a low-power mode, a reduced power level may be supplied to certain transmitter and/or receiver components in the portable communication device.

A voltage-controlled oscillator (VCO) is a frequency synthesizer commonly used in circuits such as phase-locked loops (PLLs). An RF receiver may use a PLL in a local oscillator (LO) signal generator circuit that is part of the circuitry that downconverts the received RF signal to a baseband frequency by providing the RF signal and the LO signal to respective inputs of a mixer. In some receiver architectures, it is advantageous to occasionally operate in a low-power mode, for example to conserve power and extend the amount of time which a portable device including the receiver can operate.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that relative dimensions of elements depicted in the drawing figures may not be to scale.

In one aspect of the disclosure, a frequency synthesizer system may include a first VCO circuit, a second VCO circuit, and multiplexing circuitry. The first VCO circuit may include an inductive-capacitive (LC) VCO. The second VCO circuit may include a ring oscillator. The multiplexing circuitry may be configured to select either the output of the first VCO circuit or the output of the second VCO circuit in response to a mode selection signal.

In another aspect of the disclosure, a frequency synthesizer system may include a first VCO circuit, a second VCO circuit, multiplexing circuitry, and a frequency divider circuit. An input of the frequency divider circuit may be coupled to an output of the first VCO circuit. An output of the frequency divider circuit may be coupled to an input of the multiplexing circuitry. The multiplexing circuitry may be configured to select either the output of the frequency divider circuit or the output of the second VCO circuit in response to a mode selection signal.

In another aspect of the disclosure, a frequency synthesizer system for generating a local oscillator (LO) signal may include a first VCO circuit configured to generate a first output signal having a first frequency, a second VCO circuit configured to generate a second output signal having a second frequency, and multiplexing circuitry. The first frequency may be a multiple of the second frequency. The multiplexing circuitry may be configured to produce the LO signal by selecting either the first output signal or the second output signal in response to a mode selection signal.

In another aspect of the disclosure, a method for selecting a selected frequency synthesizer in an RF receiver may include receiving a mode selection signal, and selecting either the output of a first VCO circuit or the output of a second VCO circuit in response to the mode selection signal. The first VCO circuit may include an LC VCO, and the second VCO circuit may include a ring oscillator.

In still another aspect of the disclosure, an apparatus for selecting a frequency synthesizer in an RF receiver may include means for receiving a mode selection signal, and means for selecting either the output of a first VCO circuit or the output of a second VCO circuit in response to the mode selection signal. The first VCO circuit may include an LC VCO, and the second VCO circuit may include a ring oscillator.

In a still further aspect of the disclosure, a frequency synthesizer system in an RF receiver may include a first VCO circuit, a second VCO circuit, and multiplexing circuitry. The first VCO circuit may include an LC VCO. The second VCO circuit may include a ring oscillator. The multiplexing circuitry may be configured to select the output of the first VCO circuit in response to a mode selection signal having a state indicating operation of the RF receiver in a higher-power mode and to select the output of the second VCO circuit in response to the mode selection signal having a state indicating operating of the RF receiver in a lower-power mode.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described herein may be performed in an order different from that described, and various steps may be added, omitted, or combined. Also, features described with respect to some examples may be combined in other examples.

Power saving is an important consideration in portable communication devices, such as wireless device 110 described below. Under certain operating conditions, a radio frequency (RF) transmitter and/or receiver may tolerate a lower signal-to-noise ratio (SNR), and the wireless device may be configured to operate with a lower SNR in a low-power mode. For example, in a low-power mode, a reduced power level may be supplied to certain receiver and/or transmitter components, in contrast with a mode in which a higher power level is supplied to maintain a higher SNR.

A voltage-controlled oscillator (VCO) is a frequency synthesizer commonly used in circuits such as phase-locked loops (PLLs). An RF receiver may use a PLL in a local oscillator (LO) signal generator circuit that is part of the circuitry that downconverts the received RF signal to a baseband frequency by providing the RF signal and the LO signal to respective inputs of a mixer. Similarly, an RF transmitter may use a PLL in a local oscillator (LO) signal generator circuit that is part of the circuitry that upconverts a baseband signal to an RF frequency for transmission by providing the baseband signal and the LO signal to respective inputs of a mixer. In some receiver and/or transmitter architectures, a divider circuit may operate upon the output signals of one or more VCOs to produce different frequency bands and/or to produce signals of lower frequency and of multiple phases. These signals may then be provided to the mixer.

In a receiver and/or transmitter architecture in which the outputs of one or more VCOs are divided in frequency and provided in the form of multiple phases, it may be difficult to achieve a substantial power reduction in a low-power mode because lowering the supply voltage may adversely impact the VCO startup gain, the multi-phase divider circuit functionality, or other aspects. Certain embodiments described herein provide a VCO that is operable in a low power mode and/or overcomes certain of the challenges described above.

Figure 1:
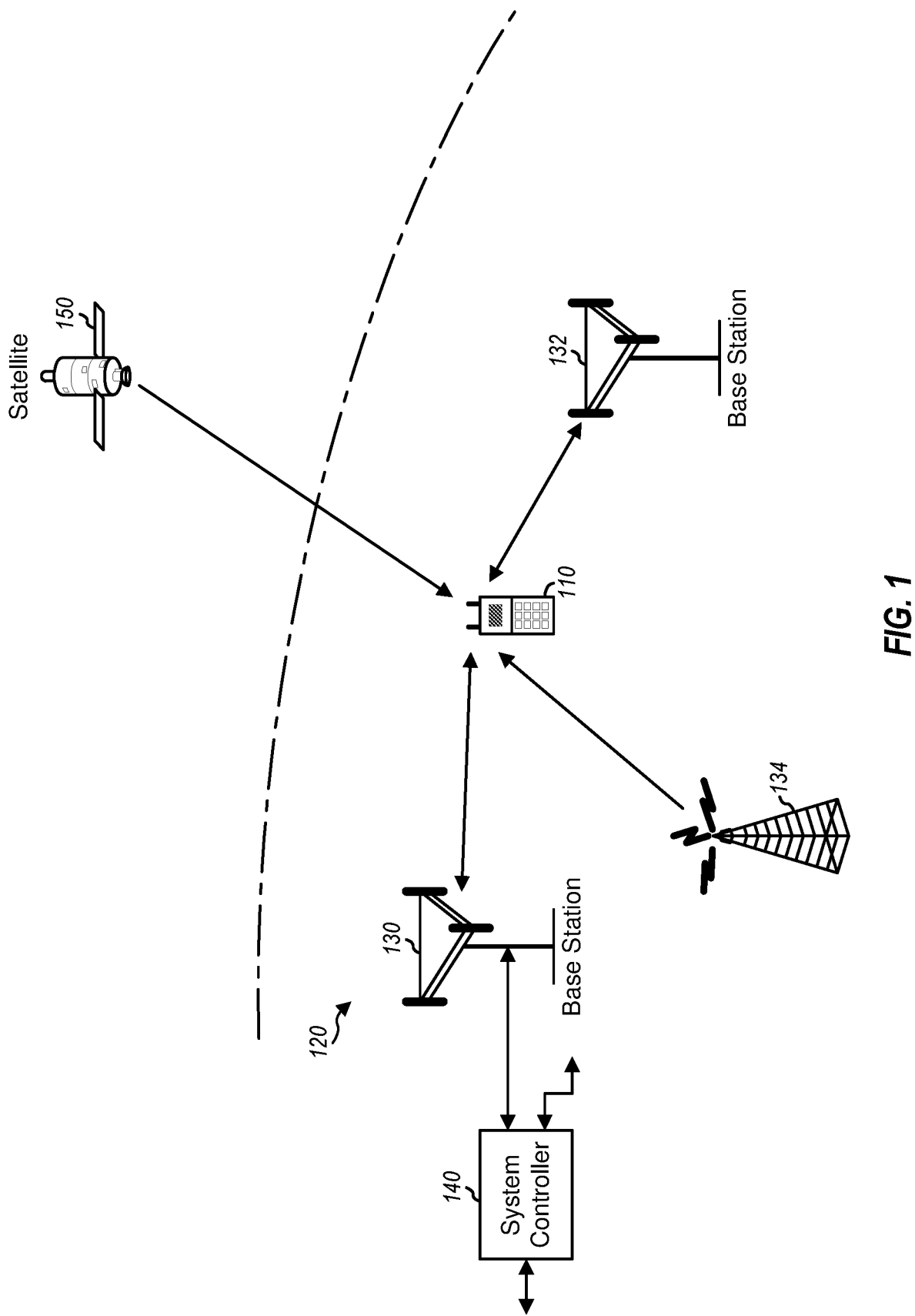
FIG. 1 is a block diagram of a wireless communication system, in accordance with various aspects of the present disclosure.

FIG. 1 illustrates an example of a wireless device 110 operating in a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For clarity, FIG. 1 shows wireless communication system 120 including two base stations 130 and 132 and one system controller 140. More generally, such a wireless communication system may include any number of such base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a hand-held device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate bidirectionally with base stations 130 and 132, with one or more access points, and/or with one or more other wireless or mobile devices. Wireless device 110 may receive signals from broadcast stations (e.g., a broadcast station 134). Wireless device 100 may further receive signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

Figure 2:
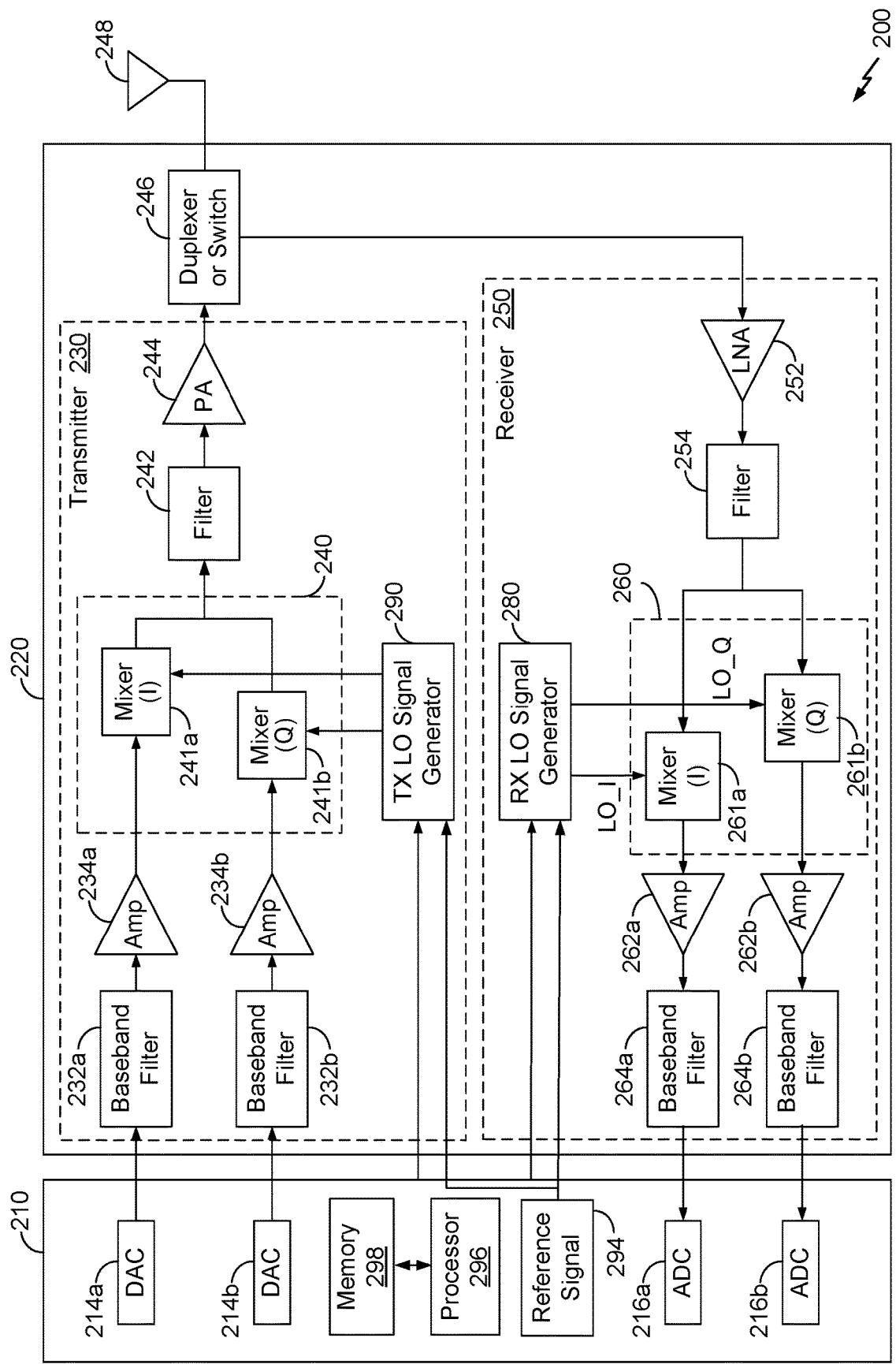
FIG. 2 is a block diagram of transceiver-related portions of a wireless device, in accordance with various aspects of the present disclosure.

FIG. 2 illustrates a wireless device 200 in which exemplary circuits, devices, systems, methods, apparatuses, etc., in accordance with the present disclosure may be embodied or implemented. Wireless device 200 may be an example of above-described wireless device 110 (FIG. 1).

Wireless device 200 may include a transceiver 220 having a transmitter 230 and a receiver 250. In general, the conditioning of the signals in the transmitter 230 and the receiver 250 may be performed by one or more stages of amplifier, filter, upconverter, downconverter, or other circuit blocks. The arrangement or configuration of the circuit blocks shown in FIG. 2 is intended as an example, and the arrangement or configuration of such circuitry may be different in other embodiments. In such other embodiments (not shown) additional circuitry may be included to condition the signals in the transmitter 230 and receiver 250. Likewise, in such other embodiments one or more of the circuit blocks shown in FIG. 2 may be omitted. Also, unless otherwise noted, any signal shown in FIG. 2, or any other figure in the drawings, may be either single-ended or differential.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DACs) 214a and 214b for converting digital signals generated by the data processor 210 into the I and Q analog output signals, e.g., I and Q output currents, for further processing. In other embodiments (not shown), the DACs 214a and 214b may be included in the transceiver 220, and the data processor 210 may provide data (e.g., for I and Q) to the transceiver 220 digitally.

Within the transmitter 230, lowpass filters 232a and 232b filter the I and Q analog transmit (communication) signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. Depending on various factors, the power amplifier 244 can be configured to operate using one or more driver stages, one or more power amplifier stages, one or more impedance matching networks, and can be configured to provide linearity, efficiency, or a combination of linearity and efficiency. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADCs) 216a and 216b for converting the analog input signals into digital signals to be further processed by the data processor 210. In other embodiments (not shown), the ADCs 216a and 216b may be included in the transceiver 220 and provide data to the data processor 210 digitally.

The TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. Although in the embodiment illustrated in FIG. 2 the circuitry of TX LO signal generator 290 is distinct from the circuitry of RX LO signal generator 280, in other embodiments (not shown) circuitry that is common to both the RX LO signal generator 280 and TX LO signal generator 290 may be provided in combined LO generator circuitry, and the remaining circuitry of the RX LO signal generator 280 and TX LO signal generator 290 may share the common circuitry.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

Figure 3A:
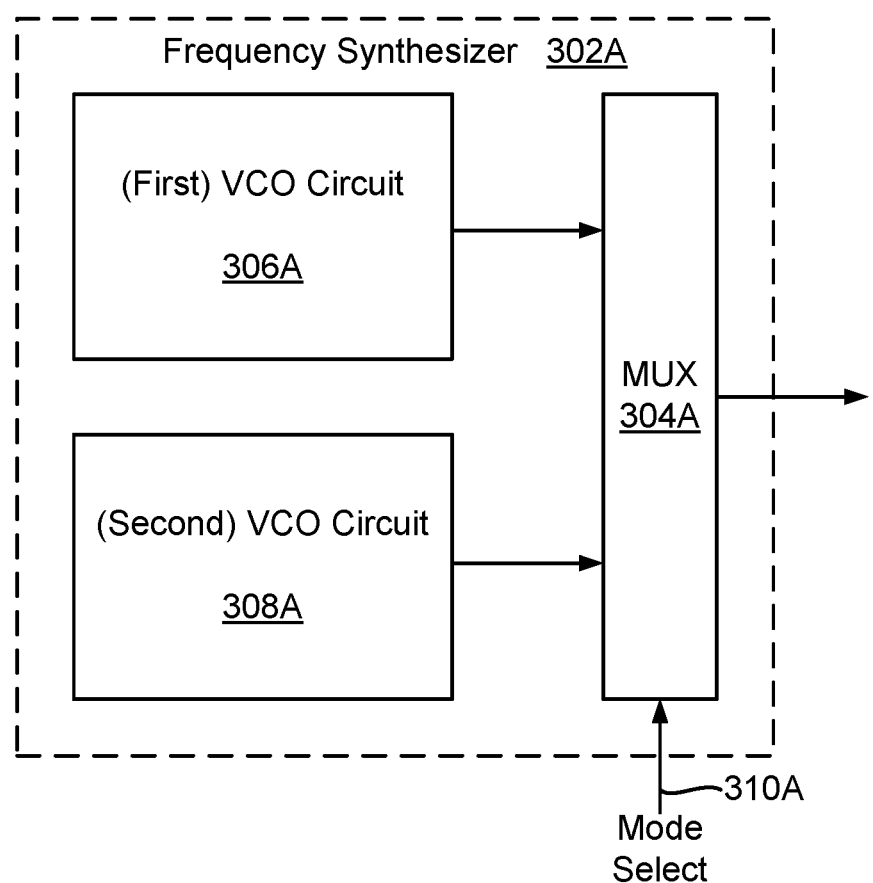
FIG. 3A is a block diagram showing a frequency synthesizer system having a selectable low-power mode, in accordance with various aspects of the present disclosure.

FIG. 3A illustrates a frequency synthesizer system 302A comprising a first voltage-controlled oscillator (VCO) circuit 306A, a second VCO circuit 308A, and multiplexing circuitry 304A. The multiplexing circuitry 304A is configured to select either the output of the first VCO circuit 306A or the output of the second VCO circuit 308A in response to a mode selection signal 310A. The mode selection signal 310A may be provided by, for example, the data processor 210 described above with regard to FIG. 2. The mode selection signal 310A may be, for example, a power mode selection signal as described below. In some embodiments, one or both of the VCO circuits 306A, 308A is included in a PLL.

Figure 3B:
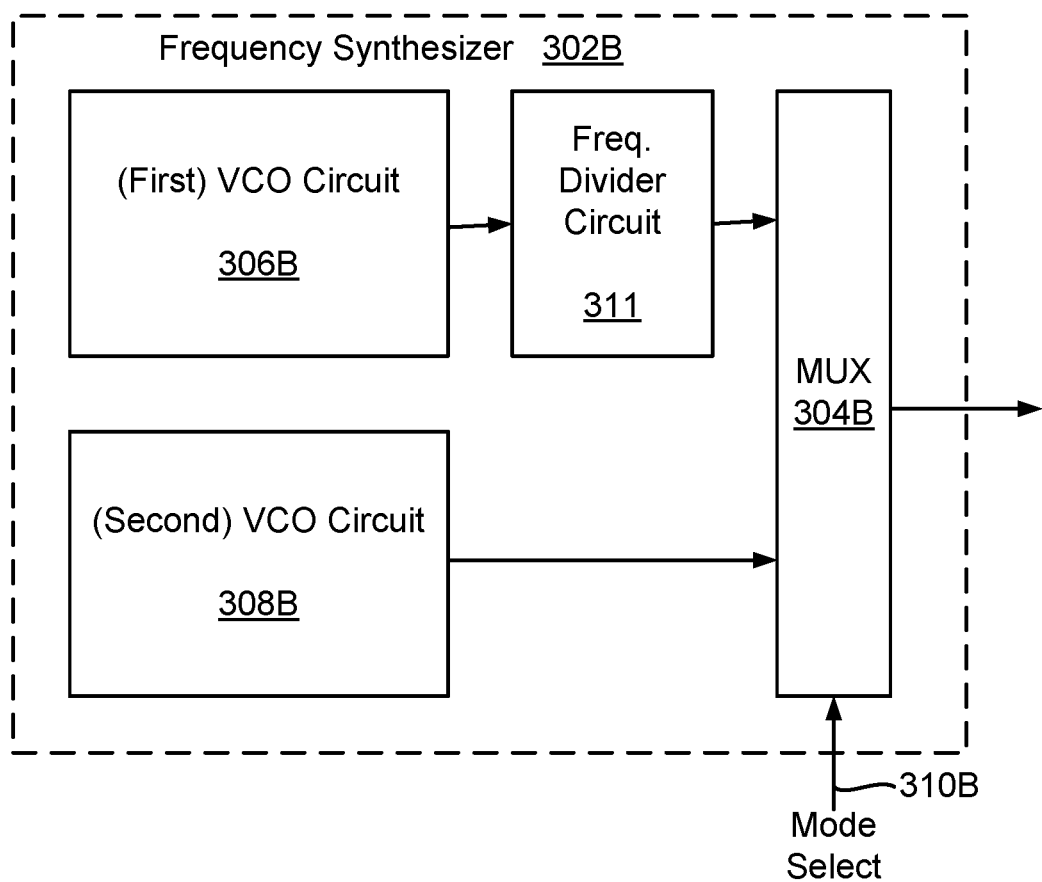
FIG. 3B is a block diagram showing another frequency synthesizer system having a selectable low-power mode, in accordance with various aspects of the present disclosure.

FIG. 3B illustrates a frequency synthesizer system 302B comprising a first VCO circuit 306B, a second VCO circuit 308B, multiplexing circuitry 304B, and a frequency divider circuit 311. The frequency synthesizer system 302B may be configured to produce an LO signal having an LO frequency. The first VCO circuit 306B may be configured to produce an output signal having a frequency that is a multiple (M) of the frequency of the output signal produced by the second VCO circuit 308B. The frequency of the output signal produced by the second VCO circuit 308B may be the LO frequency. The output of the first VCO circuit 306B is coupled to the input of the frequency divider circuit 311. The frequency divider circuit 311 may be configured to divide by M. Alternatively, the frequency divider circuit 311 may be configured to divide by another number. The output of the frequency divider circuit 311 is coupled to one input of the multiplexing circuitry 304B. The output of the second VCO circuit 308B is coupled to another input of the multiplexing circuitry 304B, with no intervening frequency divider. The multiplexing circuitry 304B is configured to select either the output of the frequency divider circuit 311 or the output of the second VCO circuit 308B in response to a mode selection signal 310B. The multiplexing circuitry 304B thus outputs the LO signal, which, in an embodiment in which the frequency divider circuit 311 is configured to divide by M, has the same LO frequency regardless of whether the first VCO circuit 306B is selected or the second VCO circuit 308B is selected. The mode selection signal 310B may be provided by, for example, the data processor 210 described above with regard to FIG. 2. The mode selection signal 310B may be, for example, a power mode selection signal as described below. In some embodiments, one or both of the VCO circuits 306B, 308B is included in a PLL. While the frequency divider circuit 311 is illustrated as being distinct from the VCO circuit 306B, in some embodiments the frequency divider circuit 311 is integrated in the VCO circuit 306B. In other embodiments, the frequency divider circuit 311 is included within a PLL in which the VCO circuit 306 is implemented. Further, while the frequency divider circuit 311 is illustrated as being in series between an output of the VCO circuit 306 and the multiplexing circuitry 304B, in some embodiments a frequency of a generated signal is divided in other ways within the VCO circuit 306B or within a PLL in which the VCO circuit 306B is implemented.

Figure 3C:
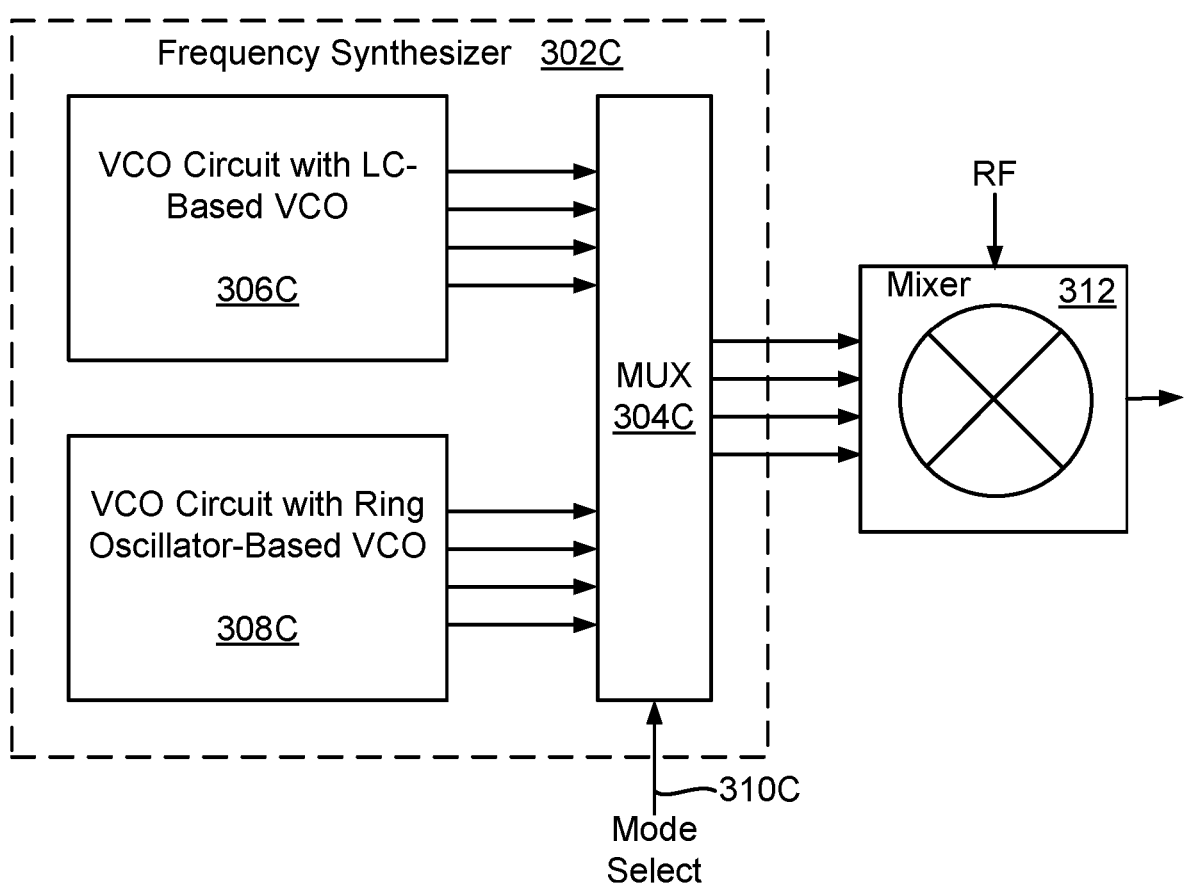
FIG. 3C is a block diagram showing still another frequency synthesizer system having a selectable low-power mode, in accordance with various aspects of the present disclosure.

FIG. 3C illustrates a frequency synthesizer system 302C coupled to a mixer 312. In the illustrated embodiment, the frequency synthesizer system 302C and mixer 312 may be examples of the RX LO signal generator 280 and downconverter 260, respectively, described above with regard to FIG. 2. Nevertheless, in other embodiments (not shown), such a frequency synthesizer system and mixer may be an example of a TX LO signal generator and upconverter. The frequency synthesizer system 302C includes a first VCO circuit 306C, a second VCO circuit 308C, and multiplexing circuitry 304C. The first VCO circuit 306C comprises or is based on an inductive-capacitive (LC) VCO (not separately shown in FIG. 3C). The second VCO circuit 308C comprises or is based on a ring oscillator (not separately shown in FIG. 3C) rather than an LC VCO or other inductive or capacitive oscillator circuitry. As described in further detail below, while an LC VCO is generally a high performance, low noise type of VCO, a ring oscillator VCO is generally more tolerant of noise than an LC VCO and is operable at lower power levels than an LC VCO. In some embodiments, one or both of the VCO circuits 306C, 308C is included in a PLL. Further, a frequency divider circuit may be implemented in a signal path between an output of the VCO circuit 306C and the multiplexing circuitry 304C, or another means for dividing a signal frequency may be implemented within the VCO 306C or within a PLL in which the VCO 306C is implemented.

The frequency synthesizer system 302C has a selectable low-power mode feature. The multiplexing circuitry 304C is configured to select either the output of the first VCO circuit 306C or the output of the second VCO circuit 308C in response to a mode selection signal 310C. The multiplexing circuitry 304C provides the selected circuit output to an input of the mixer 312. The selected VCO circuit output may comprise two or more signals of differing phases. The mode selection signal 310C may be provided by, for example, the data processor 210 described above with regard to FIG. 2.

The term "low-power mode" or "lower-power mode" is used in this disclosure to refer to a mode of operation in which one or more elements of an RF receiver (e.g., receiver 250 of FIG. 2) are supplied with a lower power level than a power level with which they are supplied in another mode of operation. That other mode of operation may be referred to as a high-power mode, a higher-power mode, normal operational mode, mission mode, etc. These various terms are used for convenience only to distinguish at least two power levels relative to each other and not to relate a power level to anything else or describe other aspects. That is, regardless of which term or terms may be used, the term or terms mean only that in one mode the RF receiver is supplied with a lower power level than in the other mode.

Similarly, the mode selection signal 310 may also be referred to in this disclosure as a low-power mode selection signal, lower-power mode selection signal, etc. Regardless of which term is used, it should be understood that the mode selection signal 310 has at least two states: a first state indicating that the RF receiver is operating in a first mode in which one or more elements of the RF receiver are supplied with a lower power level than a power level with which they are supplied in a second mode of operation; and a second state indicating that the RF receiver is operating in a second mode in which the one or more elements of the RF receiver are supplied with a higher power level than with which they are supplied in the first mode of operation. The data processor 210 (FIG. 2) or a power controller (not shown) of the wireless device 200 may control the power level supplied to portions of the RF receiver in response to various operating conditions, as understood by one of ordinary skill in the art. In some embodiments, more than two VCOs of differing power, frequency output, and/or other operating characteristic are implemented. For example, a high power (and/or low SNR) VCO, reduced power (and/or reduced SNR) VCO, and low power (and/or even further reduced SNR) VCO may all be implemented and output to the multiplexing circuitry 304. The mode selection signal 310 may be used to control the multiplexing circuitry 304 to selectively pass the output of one of the VCOs to a mixer, for example the mixer 312.

Figure 4:
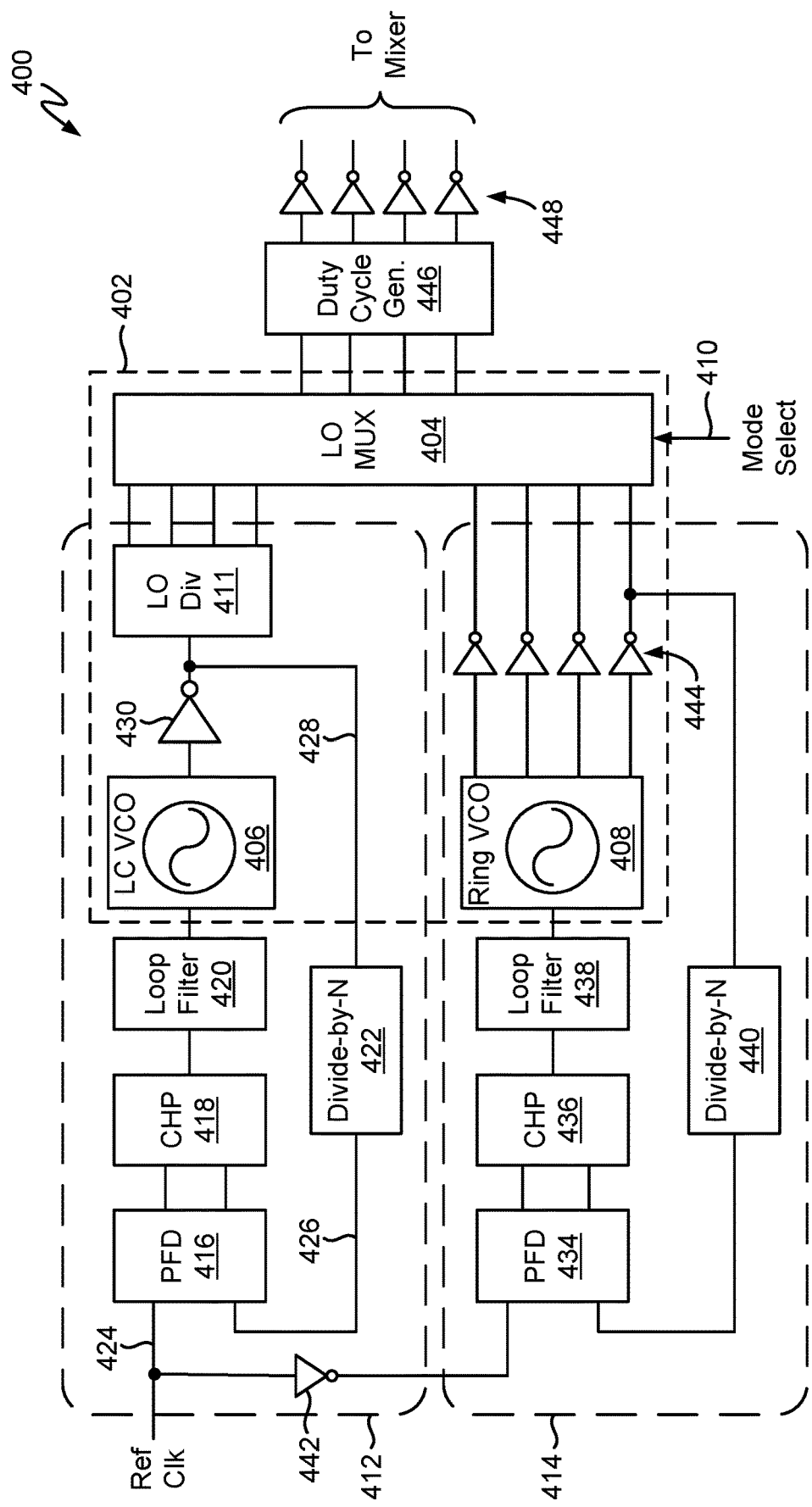
FIG. 4 is a block diagram of a local oscillator signal generator, in accordance with various aspects of the present disclosure.

FIG. 4 illustrates, among other elements, a frequency synthesizer 402 having a selectable low-power mode. In the illustrated embodiment, frequency synthesizer 402 may be included in a RX LO signal generator 400. Nevertheless, in other embodiments (not shown), such a frequency synthesizer may be included in an TX LO signal generator or other circuitry. Frequency synthesizer 402 may be an example of any of the above-described frequency synthesizer systems 302A (FIG. 3A), 302B (FIG. 3B), 302C (FIG. 3C), etc. The RX LO signal generator 400 may be an example of the above-described RX LO signal generator 280 (FIG. 2).

Frequency synthesizer 402 includes, among other elements, a multiplexer 404, an LC VCO 406, and a ring oscillator VCO 408 (also referred to as a ring VCO). Multiplexer 404 is configured to selectably couple either the output of LC VCO 406 or the output of ring oscillator VCO 408 to the multiplexer output in response to a mode selection signal 410. The LC VCO 406 is included in a first phase-locked loop (PLL) circuit 412. The ring oscillator VCO 408 is included in a second PLL circuit 414. Accordingly, multiplexer 404 is configured to selectably couple either the output of the first PLL circuit 412 or the output of the second PLL circuit 414 to the multiplexer output in response to mode selection signal 410. The mode selection signal 410 may be similar to the mode selection signal 310C described above with regard to FIG. 3C.

In the example illustrated in FIG. 4, the first PLL circuit 412 may include a phase/frequency detector (PFD) 416, a charge pump (CHP) 418, a loop filter 420, the above-described LC VCO 406, and a feedback circuit, which may comprise a programmable divider or divide-by-N circuit (NDIV) 422. The programmable divider 422 may be an integer-N divider or a fractional-N divider. The value of N may be programmable by, for example, the data processor 210 (FIG. 2). The loop filter 420 may be a low pass filter (LPF).

The PFD 416 may receive a reference (clock) signal 424 from, for example, a reference signal generator 294 (FIG. 2) in the data processor 210. In other embodiments, a reference signal element 294 is implemented separate from the data processor 210 and/or is configured to generate a reference signal based on a signal from an oscillator, for example a crystal oscillator. The PFD 416 may, for example, comprise a comparator or other circuitry configured to compare the phase and frequency of the reference clock signal 424 with a feedback signal 426, which represents a PLL output (voltage) signal 428 after processing by the programmable divider 422. Based on the comparison, the PFD 416 produces two signals, the difference in time between the rising edges of which represents the timing error. The charge pump 418 receives these two signals from the PFD 416.

The charge pump 418, which may operate as a time-to-voltage converter, then converts the timing error into a control voltage. The charge pump 418 may raise or lower its output signal DC voltage based on whether the timing error is increasing or decreasing. If the timing error is zero, then the output of the charge pump 418 is constant. The output of the charge pump 418 is coupled to an input of the loop filter 420. In an example where the loop filter 420 is a low pass filter, the loop filter 420 removes high frequency noise from the output signal of the charge pump 418 and provides a steady DC level VCO tuning voltage to a tuning input of the LC VCO 406. It should be understood that the above-described PLL architecture, based on the PFD 416, CHP 418, loop filter 420, etc., is only an example, and other embodiments may have different PLL architectures, such as, for example, a digital PLL architecture.

The LC VCO 406 produces a VCO output signal having a frequency that is directly proportional to the tuning voltage. The VCO output signal may be passed through a buffer 430 to provide the PLL output signal 428. The above-described comparison and adjustment based on the feedback loop continues until the frequency of the PLL output signal 428 equals the frequency of the reference clock signal 424.

The output of the LC VCO 406 is coupled to an input of a LO divider 411. The LO divider 411 may be an example of the above-described frequency divider circuit 311 (FIG. 3B). The LO divider 411 may be, for example, a divide-by-two (DIV/2) circuit configured to reduce the frequency of the PLL output signal 428 by a factor of two, or may be a divider configured to reduce the frequency of the PLL output signal 428 by another factor. Further, the LO divider 411 may be configured to provide the frequency-divided PLL output signal (i.e., the output of the first PLL circuit 412) in the form of multiple signals that differ in phase. For example, the output of LO divider 411 may include in-phase and quadrature LO signals separated by 90 degrees. Alternatively, or in addition, the output of LO divider 411 may include signals separated by other amounts, such as 45 degrees. Some examples of the mixer 312 (FIG. 3C) may require such multi-phase LO signals (e.g., separated by 45 degrees) to perform harmonic rejection mixing (HRM). The output of the LO divider 411 (i.e., the output of the first PLL circuit 412) is coupled to one of the two selectable multi-phase inputs of the multiplexer 404.

In the example illustrated in FIG. 4, the second PLL circuit 414 may include a PFD 434, a charge pump 436, and a loop filter 438, which may be similar to PFD 416, charge pump 418, and loop filter 420, respectively, of the above-described first PLL circuit 412. The second PLL circuit 414 may further include the above-described ring oscillator VCO 408 and a feedback circuit comprising a programmable divider 440. The same reference clock signal 424 that is provided to the PFD 416 of the first PLL circuit 412 may be provided through a buffer 442 to the PFD 434 of the second PLL circuit 414.

Except as may otherwise be noted in this disclosure, the second PLL circuit 414 may be configured and may operate as described above with regard to the first PLL circuit 412. One notable difference, however, is that while the first PLL circuit 412 includes LO divider 432 that divides the high-frequency output of LC VCO 406 down to a target LO frequency, the second PLL circuit 414 does not include such a LO divider.

Rather, as understood by one of ordinary skill in the art, ring oscillator VCO 408 is capable of operating at the lower, target LO frequency. To reduce electromagnetic coupling between the inductive elements of a LO signal generator and sensitive RF components, such as a low-noise amplifier, the LC VCO of a LO signal generator may be operated at a higher frequency than the received RF frequencies and then its output signal divided down in frequency. Operating ring oscillator VCO 408 at the target LO frequency rather than operating it at a higher frequency (or operating an LC VCO at a higher frequency) may save power.

In some embodiments (not explicitly illustrated), the circuit 411 is configured to convert the output of the Nevertheless buffer 430 to a form of multiple signals that differ in phase, but is not configured to divide the frequency of the output of the buffer 430. For example, the multiple signals that differ in phase may have the same frequency as the output of the buffer 430. In such embodiments, the input of the programmable divider 422 may be coupled to one of the outputs of the circuit 411. In these embodiments, the programmable divider 440 may be omitted in some implementations.

In some embodiments, ring oscillator VCO 408 in the second PLL circuit 414 can be operated from a substantially reduced supply voltage (e.g., in the low-power mode) without degrading its functionality. In contrast, low supply voltages could impair the startup gain of LC VCO 406 and/or impair the functionality of LO divider 432 in some embodiments. To avoid such potential adverse effects, the exemplary embodiments described herein are configured to operate the first PLL circuit 412 at a higher power level and to operate only the second PLL circuit 412 at a lower power level associated with the low-power mode. Further, the second PLL circuit 414 may occupy substantially less chip area (not shown) than the first PLL circuit 412.

Figure 5:
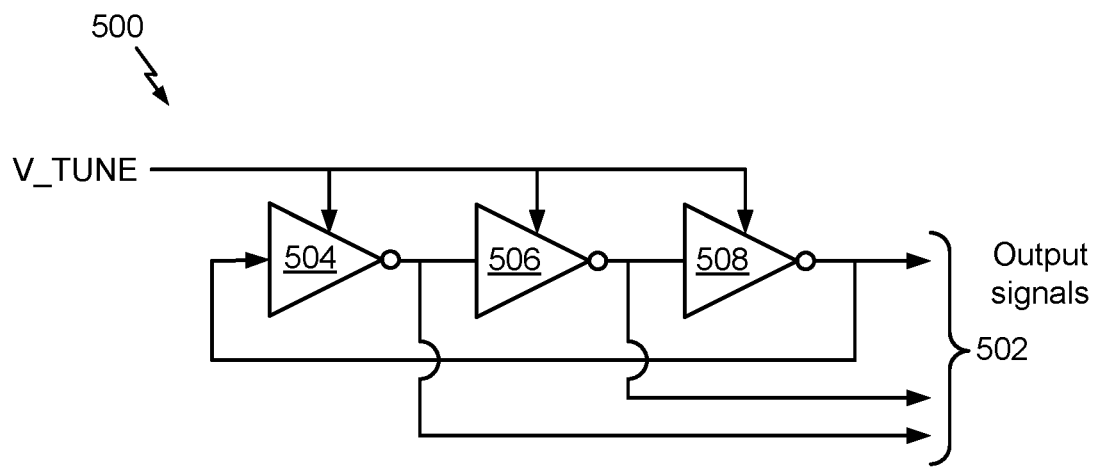
FIG. 5 is a circuit diagram of a ring oscillator VCO.

As illustrated in FIG. 5, a ring oscillator VCO 500 is capable of directly providing an output in the form of multiple signals 502 that differ in phase, as such output signals may be provided by corresponding stages 504, 506, 508, etc., of the ring topology. Each stage 504, 506, 508, etc., of ring oscillator VCO 500 may comprise an inverter circuit. For purposes of clarity, the stages 504, 506, 508, etc., are not shown at transistor level, but each may comprise a pair of transistors as understood by one of ordinary skill in the art. Although in the example shown in FIG. 5, ring oscillator VCO 500 has three stages, such a ring oscillator VCO may have more stages (generally an odd number), a more complex ring topology, or differ in other ways from the illustrated example, as understood by one of ordinary skill in the art. The frequency of the output signals 502 may be adjusted or tuned in various way, depending on the topology. One way is by driving each stage 504, 506, 508, etc., with a variable voltage, controlled by a control signal (V_TUNE). The variable voltage may be based on a supply voltage, which may be reduced when operating in a low-power mode.

Figure 6:
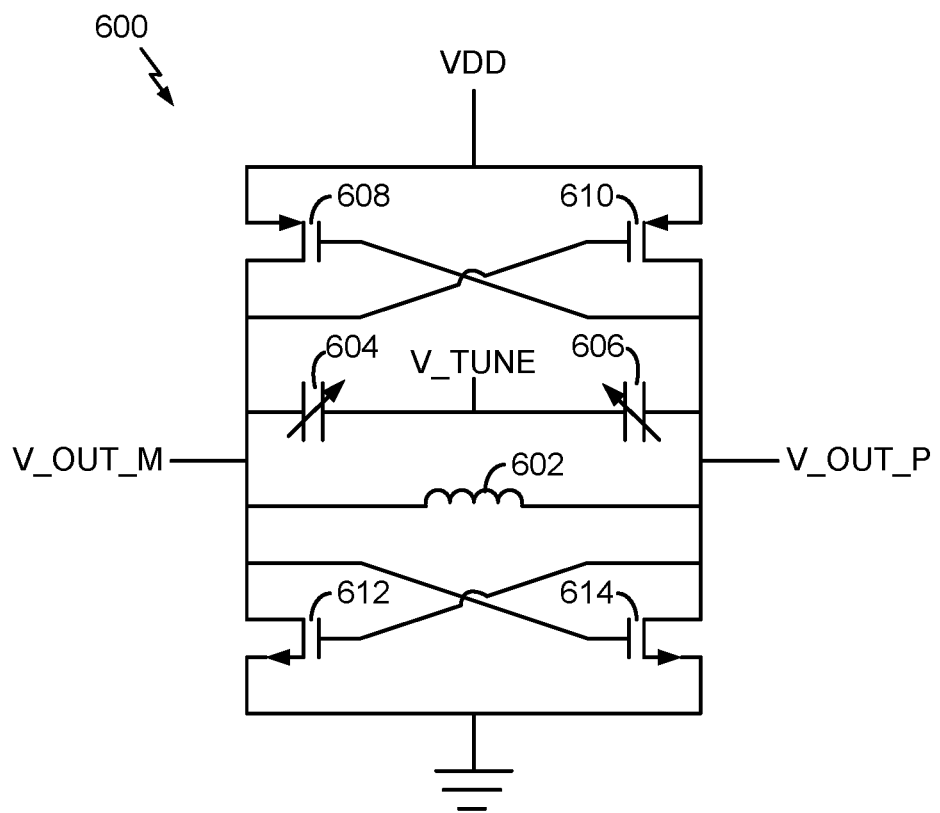
FIG. 6 is a circuit diagram of an LC VCO.

As illustrated in FIG. 6, an LC VCO 600 may include one or more inductors 602 and variable capacitances 604, 606, etc. A first pair of cross-coupled transistors 608 and 610 and/or a second pair of cross-coupled transistors 612 and 614 are configured to sustain oscillation of the output signal, shown in FIG. 5 as a differential signal (V_OUT_P and V_OUT_M). The frequency of the output signal may be adjusted or tuned by varying a control signal (V_TUNE). The VCO 600 (e.g., the sources of transistors 608, 610) may be coupled to a supply voltage (VDD).

Referring again to FIG. 4, ring oscillator VCO 408 of the second PLL circuit 414 may be configured to directly provide a set of LO signals corresponding to the set provided by LO divider 432 of the first PLL circuit 412, including in-phase and quadrature LO signals separated by 90 degrees, signals separated by other amounts, such as 45 degrees, etc. Buffers 444 may be coupled between the output of ring oscillator VCO 408 the other selectable multi-phase input of the multiplexer 404 to buffer the multi-phase, frequency-divided PLL output signals.

As described above, multiplexer 404 is configured to select one of its two multi-phase inputs in response to mode selection signal 410. Thus, the multi-phase output of the first PLL circuit 412 is provided at the multi-phase output of multiplexer 404 when the state of mode selection signal 410 indicates operation in the normal or higher-power mode, and the multi-phase output of the second PLL circuit 414 is provided at the multi-phase output of multiplexer 404 when the state of mode selection signal 410 indicates operation in the lower-power mode. A duty cycle generator 446 may be coupled to the output of multiplexer 404 to provide the multi-phase LO signals with a uniform duty cycle, such as, for example, 25 percent. The multi-phase output of duty cycle generator 446 may be coupled to the multi-phase input of mixer 304 (FIG. 3) through buffers 448.

Figure 7:
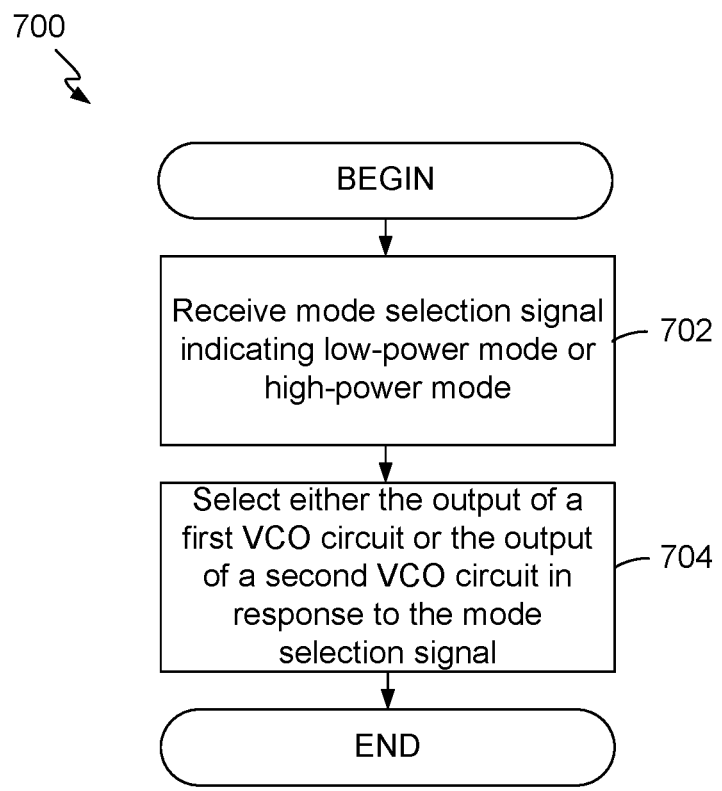
FIG. 7 is a flow diagram illustrating a method for selecting a frequency synthesizer based on a mode selection signal, in accordance with various aspects of the present disclosure.

FIG. 7 illustrates an exemplary method 700 for selecting a frequency synthesizer. As indicated by block 702, method 700 may include receiving a mode selection signal that indicates either a lower-power receiver mode or a higher-power receiver mode. As indicated by block 704, method 500 may further include selecting either the output of a first VCO circuit or the output of a second VCO circuit in response to the mode selection signal.

Figure 8:
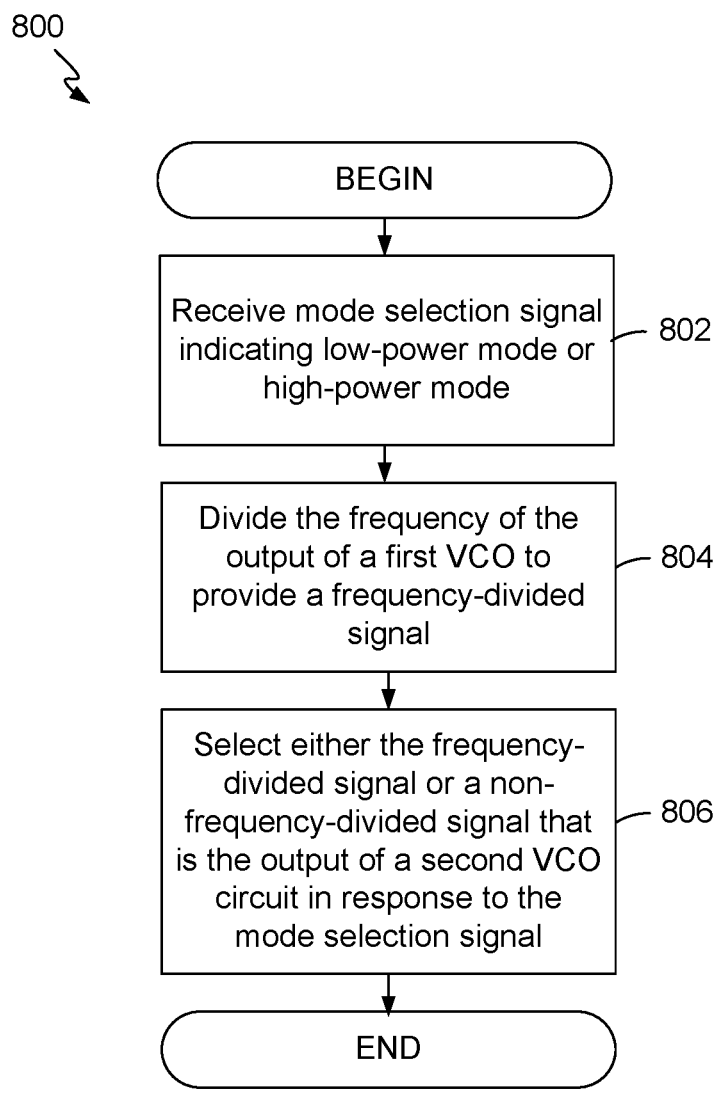
FIG. 8 is a flow diagram illustrating another method for selecting a frequency synthesizer based on a mode selection signal, in accordance with various aspects of the present disclosure.

FIG. 8 illustrates an exemplary method 800 for selecting a frequency synthesizer signal. As indicated by block 802, method 800 may include receiving a mode selection signal that indicates either a lower-power receiver mode or a higher-power receiver mode. As indicated by block 804, method 800 may further include dividing the frequency of the output of a first VCO circuit to produce a frequency-divided signal. As indicated by block 806, method 800 may still further include selecting, in response to the mode selection signal, either the frequency-divided signal or the output of a second VCO circuit that is not frequency divided. The frequency of the output of the first VCO circuit may be a multiple of the frequency of the output of the second VCO circuit.

Figure 9:
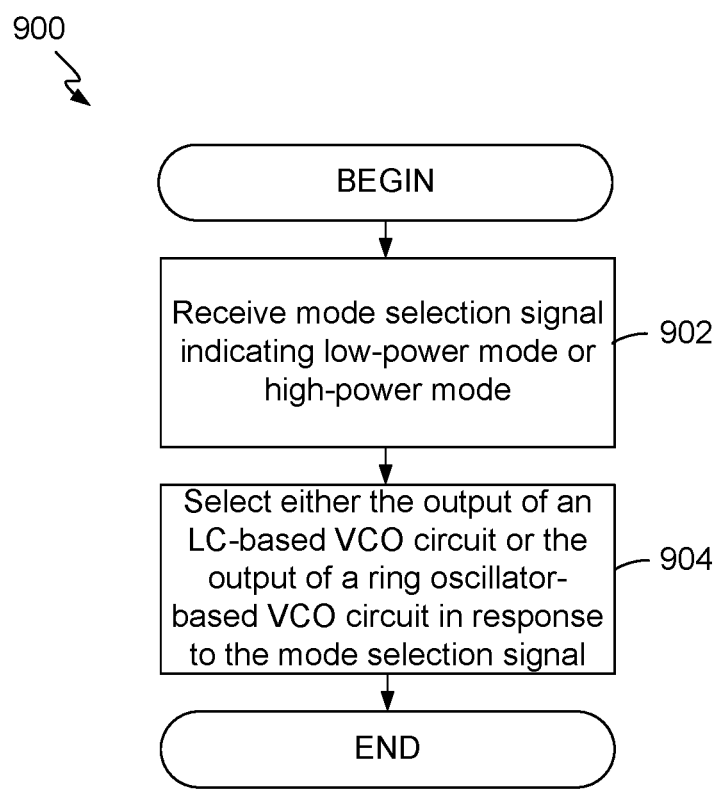
FIG. 9 is a flow diagram illustrating still another method for selecting a frequency synthesizer based on a mode selection signal, in accordance with various aspects of the present disclosure.

FIG. 9 illustrates an exemplary method 900 for coupling a selected LO frequency synthesizer to, for example, a mixer input in an RF receiver. As indicated by block 902, method 900 may include receiving a mode selection signal that indicates either a lower-power receiver mode or a higher-power receiver mode. As indicated by block 904, method 900 may further include selecting either the output of an LC-based VCO circuit or the output of a ring oscillator-based VCO circuit in response to the mode selection signal.

Any of the methods 700 (FIG. 7), 800 (FIG. 8) or 900 (FIG. 9) may be performed or controlled by the above-described wireless device 200 (FIG. 2) or portions thereof. For example, any of receiver 250 (FIG. 2), RX LO signal generator 280 (FIG. 2), multiplexers 304A (FIG. 3A), 304B (FIG. 3B), 304C (FIG. 3C), or 404 (FIG. 4) may receive a mode selection signal from, for example, data processor 210 (FIG. 2). Any of multiplexers 304A (FIG. 3A), 304B (FIG. 3B), 304C (FIG. 3C) or 404 (FIG. 4) may select either the output of the first VCO circuit 306A, 306B, 306C or the output of the second VCO circuit 308A, 308B, or 308C, or select either the output of the first PLL circuit 412 or the output of the second PLL circuit 414.

Instructions or code embodying portions of any of the methods 700, 800 or 900 may be stored in computer-readable form, i.e., firmware or software, in a memory, such as, for example, memory 298 (FIG. 2) for execution by, for example, processor 296 of data processor 210. Any such memory having firmware or software stored therein in computer-readable form for execution by a processor may be an example of a "computer program product," "computer-readable medium," etc., as such terms are understood in the patent lexicon.

Figure 10:
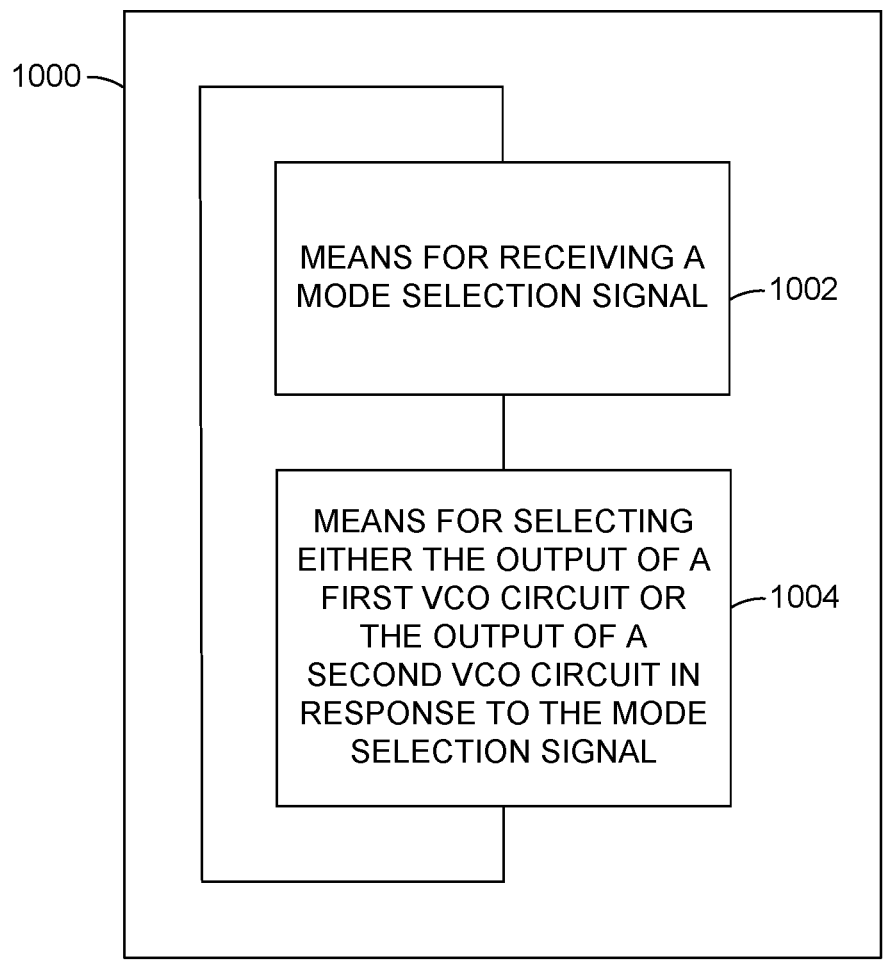
FIG. 10 is a functional block diagram of an apparatus for selecting a frequency synthesizer based on a mode selection signal, in accordance with various aspects of the present disclosure.

FIG. 10 illustrates an apparatus 1000 for selecting a frequency synthesizer. As indicated by block 1002, apparatus 1000 may include a means for receiving a mode selection signal that indicates either a lower-power receiver mode or a higher-power receiver mode. As indicated by block 1004, apparatus 1000 may further include a means for selecting either the output of a first VCO circuit or the output of a second VCO circuit in response to the mode selection signal.

Figure 11:
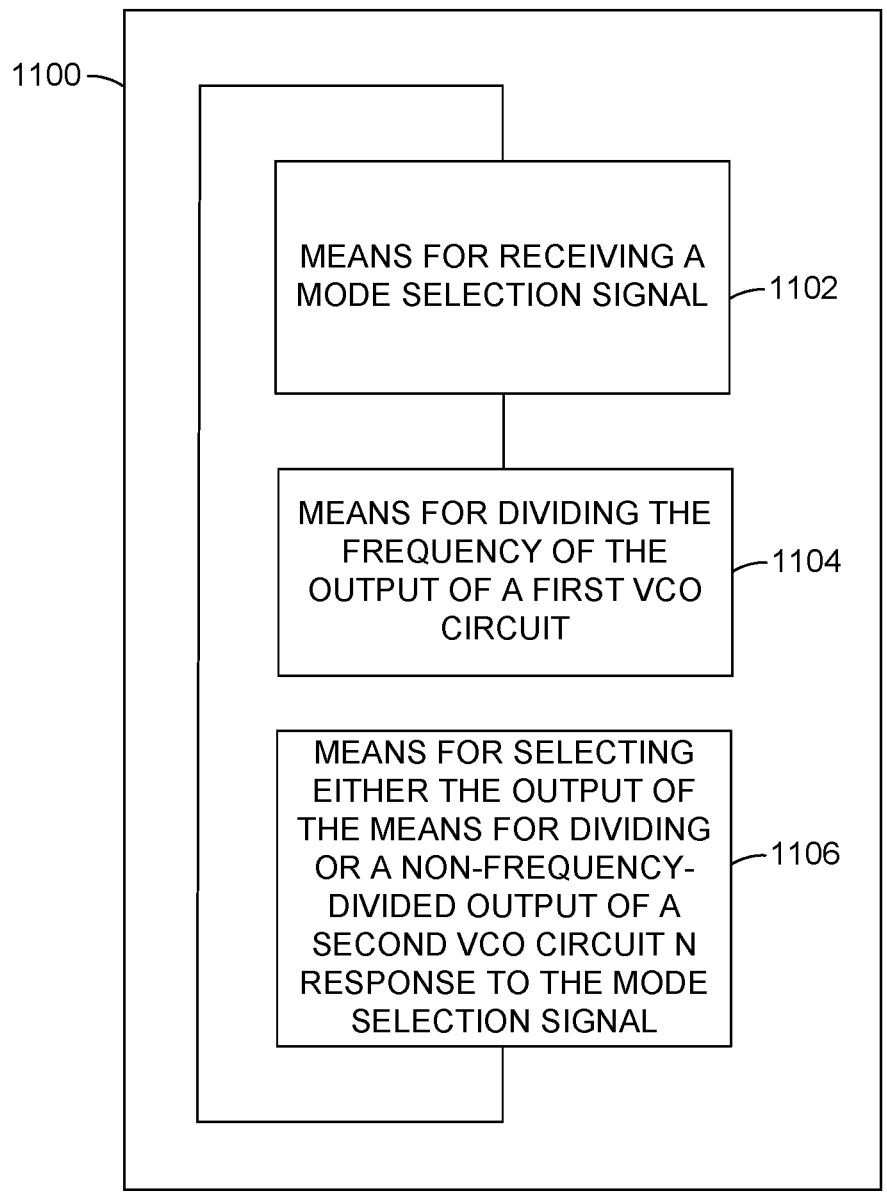
FIG. 11 is a functional block diagram of another apparatus for selecting a frequency synthesizer based on a mode selection signal, in accordance with various aspects of the present disclosure.

FIG. 11 illustrates an exemplary apparatus 1100 for selecting a frequency synthesizer signal. As indicated by block 1102, apparatus 1100 may include a means for receiving a mode selection signal that indicates either a lower-power receiver mode or a higher-power receiver mode. As indicated by block 1104, apparatus 1100 may further include a means for dividing the frequency of the output of a first VCO circuit to produce a frequency-divided signal. As indicated by block 1106, apparatus 1100 may still further include a means for selecting, in response to the mode selection signal, either the frequency-divided signal or the output of a second VCO circuit that is not frequency divided. The frequency of the output of the first VCO circuit may be a multiple of the frequency of the output of the second VCO circuit.

Figure 12:
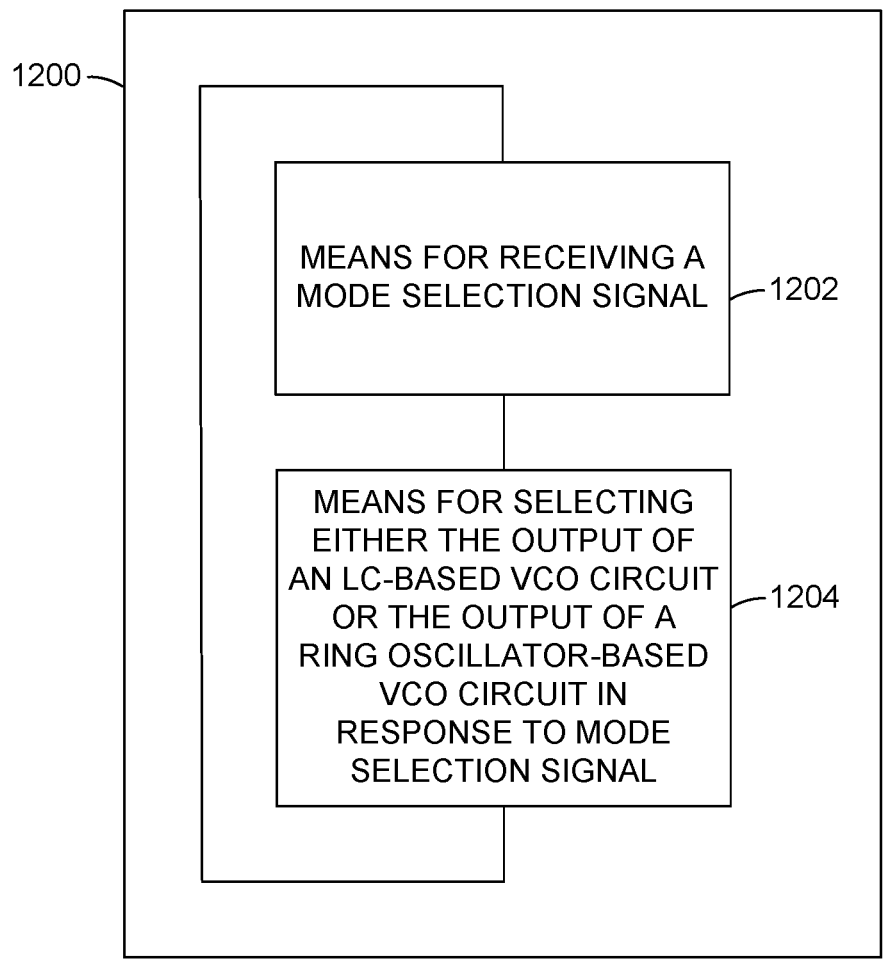
FIG. 12 is a functional block diagram of still another apparatus for selecting a frequency synthesizer based on a mode selection signal, in accordance with various aspects of the present disclosure.

FIG. 12 illustrates an apparatus 1200 for coupling a selected LO frequency synthesizer to, for example, a mixer input in an RF receiver. As indicated by block 1202, apparatus 1200 may include a means for receiving a mode selection signal that indicates either a lower-power receiver mode or a higher-power receiver mode. As indicated by block 1204, apparatus 1200 may further include a means for selecting either the output of an LC-based VCO circuit or the output of a ring oscillator-based VCO circuit in response to the mode selection signal.

In the manner described above, a frequency synthesizer system, method for coupling a selected frequency synthesizer, etc., in accordance with the present disclosure may provide benefits that include substantial power savings and therefore improved battery life. For example, a ring oscillator-based VCO circuit may be operable at a supply voltage below a level that might degrade the performance of an LC-based VCO circuit. While certain of the embodiments described herein may provide particular advantages with respect to RF receivers, implementations are not limited to such embodiments. Configurations described herein may be used to implement frequency synthesizer systems in other contexts and having other benefits.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The detailed description set forth above in connection with the appended drawings describes examples and does not represent the only examples that may be implemented or that are within the scope of the claims. The terms "example" and "exemplary," when used in this description, mean "serving as an example, instance, or illustration," and do not mean "preferred" or "advantageous over other examples."

The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Non-transitory computer-readable media include both computer storage media and communication media including any non-transitory medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. "Disk" and "disc," as used may be herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable media.

The foregoing is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

Therefore, although selected aspects have been illustrated and described in detail, it will be understood that various substitutions and alterations may be made therein without departing from the spirit and scope of the present invention, as defined by the following claims.

What is claimed is:

1. A frequency synthesizer system, comprising:
   a first voltage-controlled oscillator (VCO) circuit comprising an inductive-capacitive VCO;
   a second VCO circuit comprising a ring oscillator;
   multiplexing circuitry configured to select one of an output of the first VCO circuit and an output of the second VCO circuit in response to a mode selection signal; and
   a frequency divider circuit having an input coupled to an output of the first VCO circuit and having an output coupled to an input of the multiplexing circuitry, wherein the multiplexing circuitry is configured to select one of the output of the frequency divider circuit and the output of the second VCO circuit in response to the mode selection signal.

2. The frequency synthesizer system of claim 1, wherein:
   the first VCO circuit is included in a first phase-locked loop (PLL) circuit; and
   the second VCO circuit is included in a second PLL circuit.

3. The frequency synthesizer system of claim 2, further comprising a mixer, wherein an output of the multiplexing circuitry is coupled to an input of the mixer.

4. The frequency synthesizer system of claim 2, wherein the first VCO circuit and the second VCO circuit are included in an RF receiver local oscillator (LO) circuit.

5. The frequency synthesizer system of claim 4, wherein a first state of the mode selection signal indicates a lower-power mode of operation of the RF receiver, and a second state of the mode selection signal indicates a higher-power mode of operation of the RF receiver.

6. The frequency synthesizer system of claim 1, wherein the output of the frequency divider circuit comprises a first plurality of phase signals differing in phase from each other.

7. The frequency synthesizer system of claim 6, wherein:
   the first VCO circuit is included in a first phase-locked loop (PLL) circuit; and
   the second VCO circuit is included in a second PLL circuit.

8. The frequency synthesizer system of claim 7, wherein an output of the ring oscillator comprises a second plurality of phase signals differing in phase from each other, and the multiplexing circuitry is configured to select one of the first plurality of phase signals and the second plurality of phase signals in response to the mode selection signal.

9. The frequency synthesizer system of claim 8, further comprising a mixer, wherein the multiplexing circuitry is configured to selectively couple all of the first plurality of phase signals or all of the second plurality of phase signals to an input of the mixer.

10. The frequency synthesizer system of claim 6, wherein the input of the frequency divider circuit comprises a fewer number of signals than the first plurality of phase signals.

11. A method for selecting a frequency synthesizer in a radio frequency receiver, comprising:
    receiving a mode selection signal;
    selecting one of an output of a first voltage-controlled oscillator (VCO) circuit and an output of a second VCO circuit in response to the mode selection signal, the first VCO circuit comprising an inductive-capacitive VCO, and the second VCO circuit comprising a ring oscillator; and
    dividing a frequency of an output of the first VCO circuit to provide a frequency-divided output, wherein selecting one of the output of the first VCO circuit and the output of the second VCO circuit comprises selecting one of the frequency-divided output and the output of the second VCO circuit in response to the mode selection signal.

12. The method of claim 11, wherein selecting one of the output of the first VCO circuit and the output of the second VCO circuit comprises selecting one of an output of a first phase-locked loop (PLL) circuit and an output of a second PLL circuit.

13. The method of claim 12, further comprising coupling a selected one of the output of the first VCO circuit and the output of the second VCO circuit to an input of a mixer.

14. The method of claim 12, wherein selecting one of the output of the first VCO circuit and the output of the second VCO circuit comprises providing a selected VCO circuit output in an RF receiver local oscillator (LO) circuit.

15. The method of claim 14, wherein selecting one of the output of the first VCO circuit and the output of the second VCO circuit comprises selecting the output of the first VCO circuit when a state of the mode selection signal indicates a higher-power mode of operation of the RF receiver, and selecting the output of the second VCO circuit when the state of the mode selection signal indicates a lower-power mode of operation of the RF receiver.

16. The method of claim 11, wherein dividing the frequency of the output of the first VCO circuit to provide a frequency-divided output comprises providing a first plurality of phase signals differing in phase from each other.

17. The method of claim 16, wherein selecting one of the output of the first VCO circuit and the output of the second VCO circuit comprises selecting one of an output of a first phase-locked loop (PLL) circuit and an output of a second PLL circuit.

18. The method of claim 17, wherein an output of the ring oscillator comprises a second plurality of phase signals differing in phase from each other, and selecting one of the output of the first VCO circuit and the output of the second VCO circuit comprises selecting one of the first plurality of phase signals and the second plurality of phase signals in response to the mode selection signal.

19. An apparatus for selecting a frequency synthesizer in a radio frequency receiver, comprising:
    means for receiving a mode selection signal;

means for selecting one of an output of a first voltage-controlled oscillator (VCO) circuit and an output of a second VCO circuit in response to the mode selection signal, the first VCO circuit comprising an inductive-capacitive VCO, and the second VCO circuit comprising a ring oscillator; and means for dividing a frequency of an output of the first VCO circuit and providing a frequency-divided output to an input of the multiplexing circuitry, wherein the means for selecting one of the output of the first VCO circuit and the output of the second VCO circuit comprises means for selecting one of the frequency-divided output and the output of the second VCO circuit in response to the mode selection signal.

20. The apparatus of claim 19, wherein the means for selecting one of the output of the first VCO circuit and the output of the second VCO circuit comprises means for selecting one of an output of a first phase-locked loop (PLL) circuit and an output of a second PLL circuit.

21. The apparatus of claim 20, further comprising means for coupling an output of the multiplexer circuitry to an input of a mixer.

22. The apparatus of claim 20, wherein the means for selecting one of the output of the first VCO circuit and the output of the second VCO circuit comprises means for providing a selected VCO circuit output in an RF receiver local oscillator (LO) circuit.

23. The apparatus of claim 19, wherein the means for dividing and providing comprises providing means for providing a first plurality of phase signals differing in phase from each other.

24. The apparatus of claim 23, wherein the means for selecting one of the output of the first VCO circuit and the output of the second VCO circuit comprises means for selecting one of an output of a first phase-locked loop (PLL) circuit and an output of a second PLL circuit.

25. An apparatus for processing communication signals, comprising:
a mixer configured to mix a communication signal with a local oscillator signal having a first frequency; and
a local oscillator comprising
a first voltage-controlled oscillator (VCO) circuit configured to output a first signal at the first frequency,
a second VCO circuit configured to output a second signal at a second frequency higher than the first frequency,
a frequency divider circuit configured to receive the second signal at the second frequency and output a third signal at the first frequency, and
multiplexing circuitry configured to selectively couple the first signal or the third signal to an output of the local oscillator in response to a mode selection signal.

26. The apparatus of claim 25, wherein:
the first VCO circuit is included in a first phase-locked loop (PLL) circuit; and
the second VCO circuit is included in a second PLL circuit.

27. The apparatus of claim 25, further comprising a duty cycle generator coupled between an output of the multiplexing circuitry and the output of the local oscillator, the duty cycle generator configured to provide the local oscillator signal based on the first signal or the third signal.

28. The apparatus of claim 25, wherein the mixer and the local oscillator are included in a radio frequency (RF) receiver, wherein a first state of the mode selection signal indicates a lower-power mode of operation of the RF receiver, and a second state of the mode selection signal indicates a higher-power mode of operation of the RF receiver.

29. The apparatus of claim 28, wherein the multiplexing circuitry is configured to couple the first signal to the output of the local oscillator in response to the selection signal being in the first state, and wherein the multiplexing circuitry is configured to couple the third signal to the output of the local oscillator in response to the selection signal being in the second state.

* * * * *